(12) United States Patent
Tsai et al.

(10) Patent No.: US 11,205,629 B2
(45) Date of Patent: Dec. 21, 2021

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Tsung-Fu Tsai, Changhua County (TW); Shih-Ting Lin, Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 9 days.

(21) Appl. No.: 16/843,876

(22) Filed: Apr. 8, 2020

(65) Prior Publication Data

US 2021/0225791 A1 Jul. 22, 2021

Related U.S. Application Data

(60) Provisional application No. 62/963,548, filed on Jan. 21, 2020.

(51) Int. Cl.
| | |
|---|---|
| *H01L 23/00* | (2006.01) |
| *H01L 21/56* | (2006.01) |
| *H01L 23/31* | (2006.01) |
| *H01L 23/498* | (2006.01) |
| *H01L 21/48* | (2006.01) |

(52) U.S. Cl.
CPC .......... *H01L 24/20* (2013.01); *H01L 21/4857* (2013.01); *H01L 21/56* (2013.01); *H01L 23/3157* (2013.01); *H01L 23/49811* (2013.01); *H01L 23/49822* (2013.01); *H01L 23/49844* (2013.01); *H01L 24/19* (2013.01)

(58) Field of Classification Search
CPC ...... H01L 24/20; H01L 21/56; H01L 23/3157
See application file for complete search history.

(56) References Cited

U.S. PATENT DOCUMENTS

| | | | | |
|---|---|---|---|---|
| 9,356,006 | B2* | 5/2016 | Haba | H01L 23/5389 |
| 9,991,219 | B2* | 6/2018 | Seol | H01L 24/25 |
| 10,475,748 | B2* | 11/2019 | Lee | H01L 24/20 |

(Continued)

*Primary Examiner* — Nicholas J Tobergte
(74) *Attorney, Agent, or Firm* — JCIPRNET

(57) ABSTRACT

A package structure including a wiring substrate, conductive terminals, an insulating encapsulation, a redistribution circuit structure, guiding patterns and a semiconductor device. The conductive terminals are disposed on a surface of the wiring substrate. The insulating encapsulation laterally encapsulates the wiring substrate and the conductive terminals. The redistribution circuit structure is disposed on the insulating encapsulation and the conductive terminals, and the redistribution circuit structure is electrically connected to the wiring substrate through the conductive terminals. The guiding patterns are disposed between the wiring substrate and the redistribution circuit structure, and the guiding patterns are in contact with and encapsulated by the insulating encapsulation. The semiconductor device is disposed on a top surface of the redistribution circuit structure, and the semiconductor device is electrically connected to the wiring substrate through the redistribution circuit structure and the conductive terminals.

20 Claims, 9 Drawing Sheets

(56) References Cited

U.S. PATENT DOCUMENTS

| | | | |
|---|---|---|---|
| 2005/0018018 A1* | 1/2005 | Aschoff | B41J 2/1623 |
| | | | 347/63 |
| 2011/0068444 A1* | 3/2011 | Chi | H01L 21/6835 |
| | | | 257/669 |
| 2014/0252634 A1* | 9/2014 | Hung | H01L 23/48 |
| | | | 257/773 |
| 2015/0228591 A1* | 8/2015 | Kim | H01L 24/19 |
| | | | 257/692 |
| 2019/0131242 A1* | 5/2019 | Lee | H01L 23/49833 |
| 2020/0219783 A1* | 7/2020 | Kim | H01L 23/49822 |
| 2020/0365544 A1* | 11/2020 | Chen | H01L 24/17 |
| 2021/0217736 A1* | 7/2021 | Lin | H01L 21/6835 |

* cited by examiner

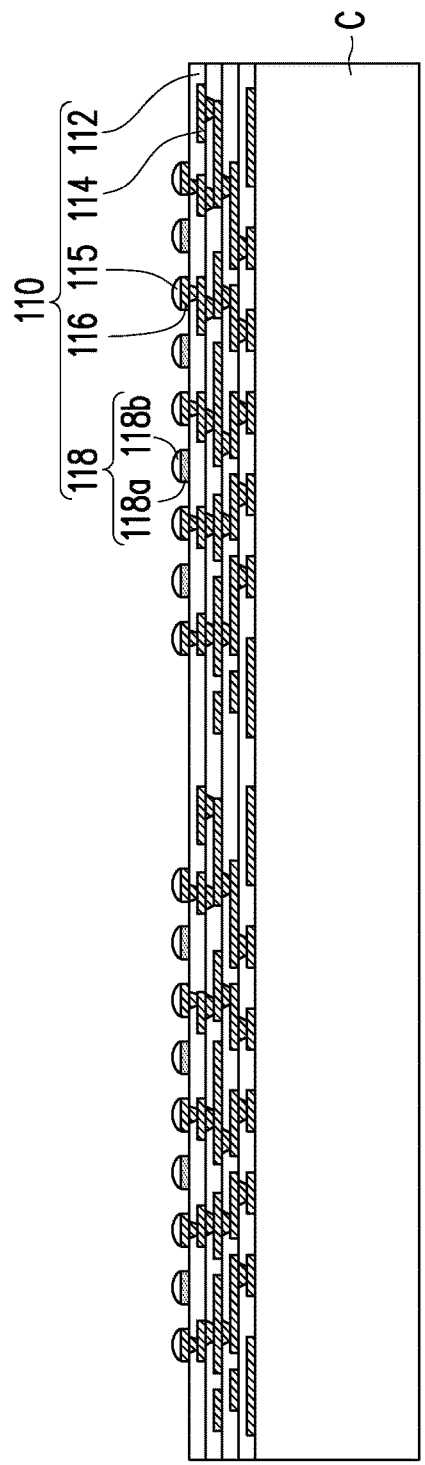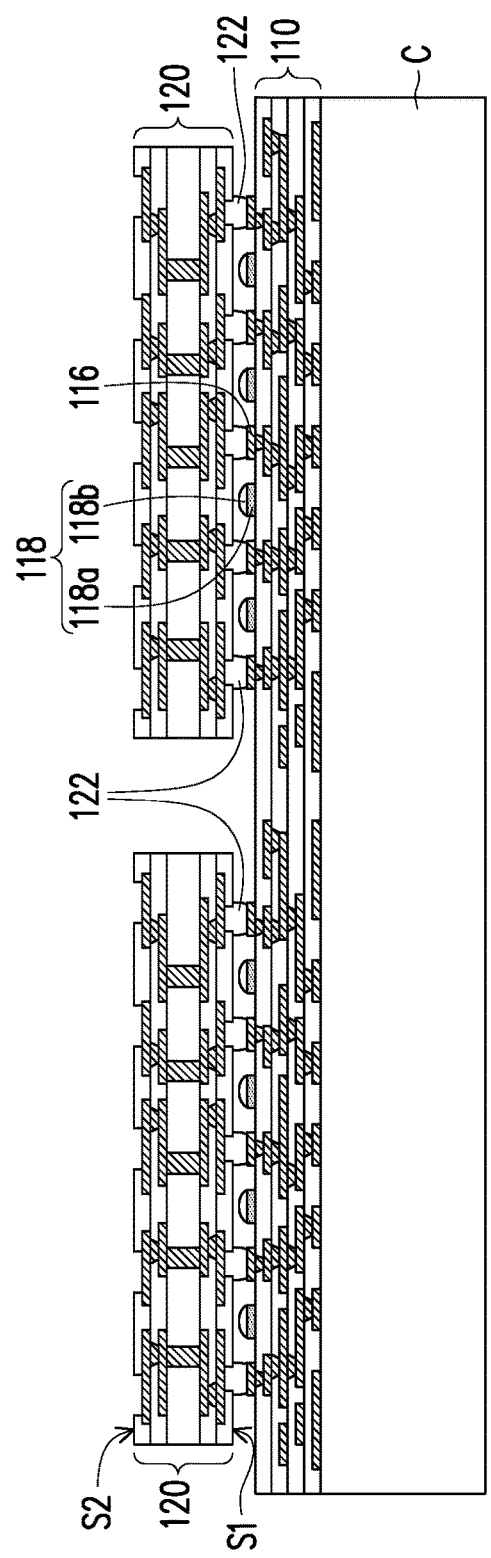
FIG. 1
FIG. 2

PACKAGE STRUCTURE AND METHOD OF FABRICATING THE SAME

CROSS-REFERENCE TO RELATED APPLICATION

This application claims the priority benefit of US provisional application Ser. No. 62/963,548, filed on Jan. 21, 2020. The entirety of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1, FIG. 2 and FIG. 4 through FIG. 6 are cross-sectional views schematically illustrating a process flow for fabricating a package structure in accordance with some embodiments of the present disclosure.

DETAILED DESCRIPTION

Figures 3A, 3B:
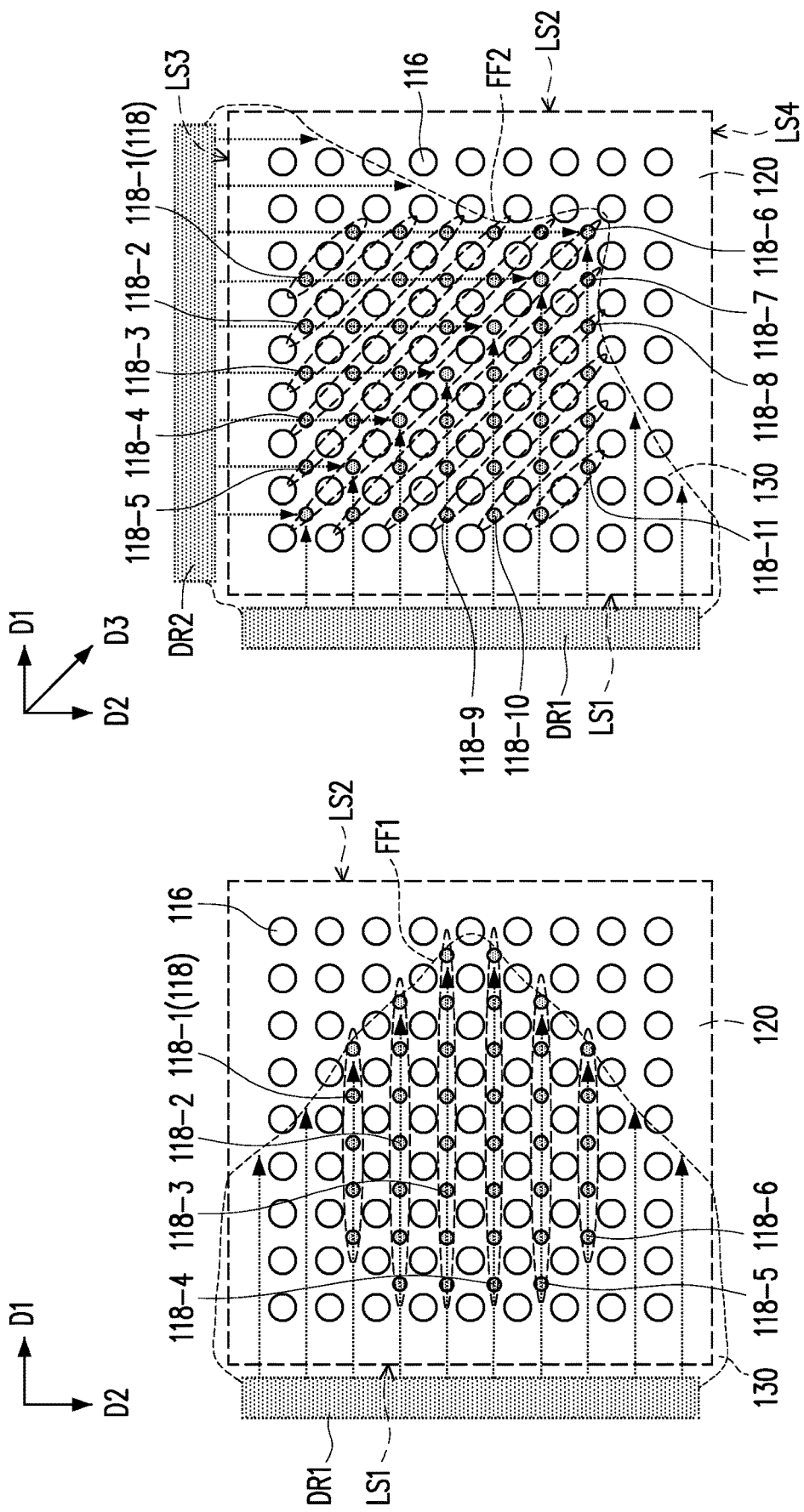
FIG. 3A and FIG. 3B are cross-sectional views schematically illustrating various distribution of guiding patterns in accordance with other embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1, FIG. 2 and FIG. 4 through FIG. 6 are cross-sectional views schematically illustrating a process flow for fabricating a package structure in accordance with some embodiments of the present disclosure. FIG. 3A and FIG. 3B are cross-sectional views schematically illustrating various distribution of guiding patterns in accordance with other embodiments of the present disclosure.

Referring to FIG. 1, a redistribution circuit structure 110 is formed over a carrier C. In some embodiments, the wafer form redistribution circuit structure 110 is formed over a wafer form glass carrier C. The redistribution circuit structure 110 may include stacked dielectric layers 112, redistribution wirings 114, conductive coatings 115, conductive pads 116, and guiding patterns 118. The stacked dielectric layers 112 is stacked over the carrier C. The redistribution wirings 114 are embedded in the stacked dielectric layers 112 carried by the carrier C. The conductive pads 116 are disposed on the stacked dielectric layers 112 and electrically connected to the redistribution wirings 114. The conductive pads 116 are arranged in array. The conductive coatings 115 are disposed on the conductive pads 116. The guiding patterns 118 are disposed on the stacked dielectric layers 112 and spatially separated from the conductive pads 116. The guiding patterns 118 are electrically insulated from the redistribution wirings 114 and the conductive pads 116.

The stacked dielectric layers 112 may include stacked polyimide (PI) layers, stacked polybenzoxazole (PBO) layers, or other suitable polymer dielectric layers. In some embodiments, the stacked dielectric layers 112 may include resin mixed with filler. The redistribution wirings 114 may include conductive wirings and conductive vias electrically connected between conductive wirings, wherein the conductive wirings may transmit signal horizontally, and the conductive vias may transmit signal vertically. The material of the redistribution wirings 114 may be the same as the material of the conductive pads 116. For example, the material of the redistribution wirings 114 (i.e. the conductive wirings and conductive vias) and the conductive pads 116 includes copper or other suitable metallic materials. The guiding patterns 118 may include dot patterns, and the dot patterns are electrically floating. In some embodiments, each guiding pattern among the guiding patterns 118 includes a dot-shaped guiding pattern 118a and a conductive coating 118b disposed on the dot-shaped guiding pattern 118a, wherein the material of the dot-shaped guiding patterns 118a is the same as that of the conductive pads 116, and the material of the conductive coatings 118b is the same as that of the conductive coatings 115. For example, the material of the conductive coatings 118b and the conductive coatings 115 includes solder material, and the conductive coatings 118b and the conductive coatings 115 are formed simultaneously through a printing process of pre-solder material. Since the conductive coatings 118b and the conductive coatings 115 can be formed through the same printing process of pre-solder material, formation of the guiding patterns 118 on the redistribution circuit structure 110 is compatible with current process and does not increase additional fabrication cost.

Referring to FIG. 2, wiring substrates 120 are provided. Each wiring substrate 120 may include first conductive terminals 122 formed thereon. In some embodiments, the wiring substrate 120 includes a first surface S1 and a second surface S2 opposite to the first surface S1, and the first conductive terminals 122 are arranged in array and distributed on the first surface S1 of the wiring substrate 120. The first conductive terminals 122 may include solder posts or solder bumps arranged in array. The wiring substrates 120 may be placed onto the redistribution circuit structure 110 such that the first surfaces S1 of the wiring substrates 120 face the redistribution circuit structure 110, and the conductive pads 116 and the guiding patterns 118 are covered by the wiring substrates 120. A reflow process is then performed such that the wiring substrates 120 are electrically connected to the conductive pads 116 of the redistribution circuit structure 110 through the first conductive terminals 122. After the wiring substrates 120 are mounted on the redistribution circuit structure 110 carried by the carrier C, spaces are defined between the wiring substrates 120 and the redistribution circuit structure 110, and the guiding patterns 118 are spaced apart from the first surfaces S1 of the wiring substrates 120 by a predetermined distance. For example, the predetermined distance between the guiding patterns 118 and the first surfaces S1 of the wiring substrates 120 ranges from about 50 micrometers to about 250 micrometers. In other words, the guiding patterns 118 are not in direct contact with the first surface S1 of the wiring substrate 120.

Figure 4:
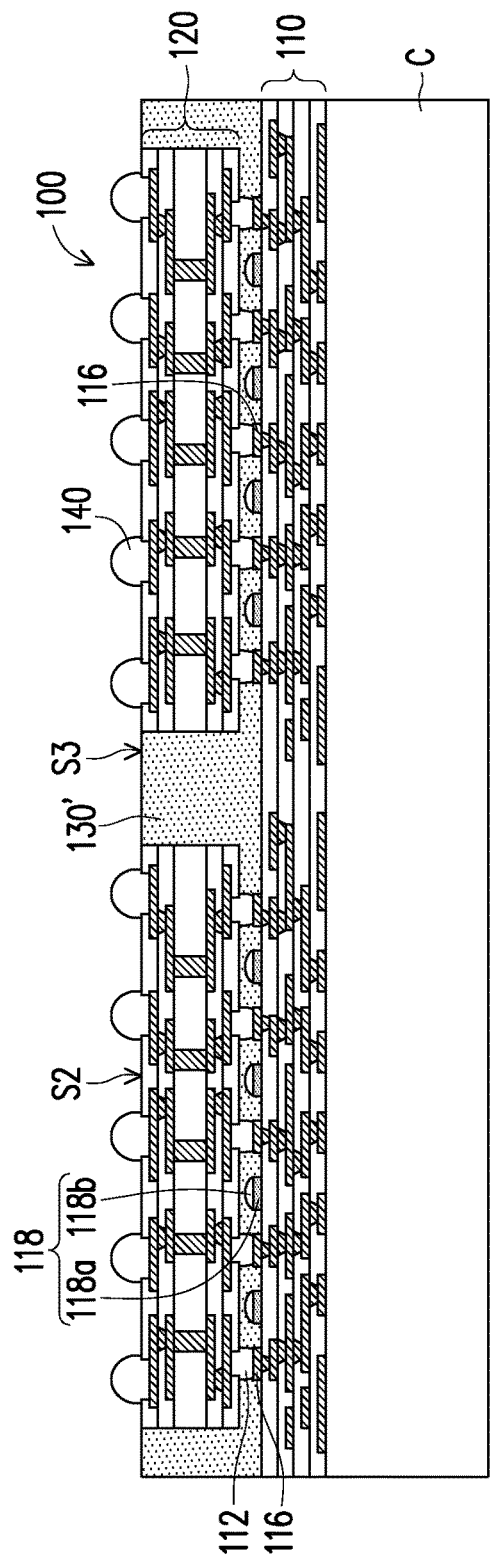

Referring to FIG. 3A and FIG. 4, a flowable encapsulation material 130 is applied onto the redistribution circuit structure 110. The flowable encapsulation material 130 may be applied onto the redistribution circuit structure 110 along a first lateral side LS1 of the wiring substrate 120, and the flowable encapsulation material 130 may flow into the space between the redistribution circuit structure 110 and the wiring substrate 120 through guidance of the guiding patterns 118. Then, the flowable encapsulation material 130 filled in the space between the redistribution circuit structure 110 and the wiring substrate 120 is cured such that an insulating encapsulation 130' is formed on the redistribution circuit structure 110 to laterally encapsulate the wiring substrate 120, the first conductive terminals 122, the conductive pads 116 and the guiding patterns 118. In some embodiments, the second surface S2 of the wiring substrate 120 is substantially leveled with, slightly lower than or slightly higher than a top surface S3 of the insulating encapsulation 130'.

After forming the insulating encapsulation 130', second conductive terminals 140 are formed on the second surface S2 of the wiring substrate 120, wherein the second conductive terminals 140 are electrically connected to the wiring substrate 120. The dimension of the second conductive terminals 140 may be greater than that of the first conductive terminals 122. In some embodiments, the second conductive terminals 140 includes ball-grid array (BGA) balls.

After forming the second conductive terminals 140, fabrication of an encapsulated wiring structure 100 including the redistribution circuit structure 110, the wiring substrate 120, the insulating encapsulation 130' and the second conductive terminals 140 is accomplished.

In some embodiments, as illustrated in FIG. 3A, the flowable encapsulation material 130 is applied to a dispensing region DR1 located aside the first lateral side LS1 (e.g., left side) of the wiring substrate 120 through a dispensing process. The flowable encapsulation material 130 dispensed along the first lateral side LS1 (e.g., left side) of the wiring substrate 120 may flow towards a second lateral side LS2 (e.g., right side) of the wiring substrate 120 along a first direction D1, wherein the second lateral side LS2 of the wiring substrate 120 is opposite to the first lateral side LS1 of the wiring substrate 120. After the flowable encapsulation material 130 is applied onto the redistribution circuit structure 110, the flowable encapsulation material 130 flows towards the second lateral side LS2 of the wiring substrate 120 from the first lateral side LS1 of the wiring substrate 120, and a flow front FF1 of the flowable encapsulation material 130 is properly controlled by distribution of the guiding patterns 118. Accordingly, void issue occurred in the insulating encapsulation 130' may be minimized.

As illustrated in FIG. 3A, the guiding patterns 118 includes multiple rows of guiding patterns 118-1, 118-2, 118-3, 118-4, 118-5 and 118-6. In some embodiments, the guiding patterns 118 includes rows (i.e. dot groups) of dot patterns, each of the dot patterns is disposed within a square region defined by four neighboring conductive pads 116, and the lateral dimension of the conductive pads 116 may be greater than that of the dot patterns. The rows of guiding patterns 118-1 and 118-6 each includes N1 dot patterns arranged along the first direction D1, the rows of guiding patterns 118-2 and 118-5 each includes N2 dot patterns arranged along the first direction D1, the rows of guiding patterns 118-3 and 118-4 each includes N3 dot patterns arranged along the first direction D1, wherein N1, N2, N3 are positive integers, and N3 is greater than N2 while N2 is greater than N1. In some embodiments, the rows of guiding patterns 118-1 and 118-6 each includes five dot patterns arranged along the first direction D1, the rows of guiding patterns 118-2 and 118-5 each includes seven dot patterns arranged along the first direction D1, the rows of guiding patterns 118-3 and 118-4 each includes eight dot patterns arranged along the first direction D1. The dot patterns of the rows of guiding patterns 118-1, 118-2, 118-3, 118-4, 118-5 and 118-6 may accelerate flow speed of the flowable encapsulation material 130 in the first direction D1 because of the small distance between the guiding patterns 118 and the first surfaces S1 of the wiring substrates 120. Various number of dot patterns in the rows of guiding patterns 118-1, 118-2, 118-3, 118-4, 118-5 and 118-6 may provide different degrees of acceleration in flow speed of the flowable encapsulation material 130. The rows of guiding patterns 118-3 and 118-4 provide high degree of acceleration in flow speed of the flowable encapsulation material 130 along the first direction D1, the rows of guiding patterns 118-2 and 118-3 provide medium degree of acceleration in flow speed of the flowable encapsulation material 130 along the first direction D1, and the rows of guiding patterns 118-1 and 118-6 provide low degree of acceleration in flow speed of the flowable encapsulation material 130 along the first direction D1.

Due to different degrees of acceleration provided by the rows of guiding patterns 118-1, 118-2, 118-3, 118-4, 118-5 and 118-6, the flow front FF1 of the flowable encapsulation material 130 can be properly controlled, and encysted voids are thus not occurred in the flowable encapsulation material 130.

Referring to FIG. 3B, the flowable encapsulation material 130 is applied to a dispensing region DR1 located aside a first lateral side LS1 (e.g., left side) of the wiring substrate 120 and a dispensing region DR2 located aside of a third lateral side LS3 (e.g., upper side) through a dispensing process. The flowable encapsulation material 130 dispensed along the first lateral side LS1 (e.g., left side) of the wiring substrate 120 may flow towards a second lateral side LS2 (e.g., right side) of the wiring substrate 120 along a first direction D1, and the flowable encapsulation material 130 dispensed along the third lateral side LS3 (e.g., upper side) of the wiring substrate 120 may flow towards a fourth lateral side LS4 (e.g., lower side) of the wiring substrate 120 along a second direction D2. The second lateral side LS2 of the wiring substrate 120 is opposite to the first lateral side LS1 of the wiring substrate 120, and the fourth lateral side LS4 of the wiring substrate 120 is opposite to the third lateral side LS3 of the wiring substrate 120. After the flowable encapsulation material 130 is applied onto the redistribution circuit structure 110, the flowable encapsulation material 130 respectively flows towards the second lateral side LS2 and the fourth lateral side LS4 of the wiring substrate 120 from the first lateral side LS1 and the third lateral side LS3 of the wiring substrate 120, and a flow front FF2 of the flowable encapsulation material 130 is properly controlled by distribution of the guiding patterns 118. Accordingly, void issue occurred in the insulating encapsulation 130' may be minimized.

As illustrated in FIG. 3B, the guiding patterns 118 includes multiple groups of guiding patterns (i.e. dot groups) 118-1, 118-2, 118-3, 118-4, 118-5, 118-6, 118-7, 118-8, 118-9, 118-10 and 118-11, each group among the groups of guiding patterns 118-1, 118-2, 118-3, 118-4, 118-5, 118-6, 118-7, 118-8, 118-9, 118-10 and 118-11 includes dot patterns arranged along a direction D3, and each of the dot patterns is disposed within a square region defined by four neighboring conductive pads 116. The third direction D3 is between the above-mentioned first and second directions D1 and D2, an included angle between the first direction D1 and the third direction D3 is 45 degrees, and an included angle between the second direction D2 and the third direction D3 is 45 degrees. The third direction D3 may be modified in accordance with the geometry of the wiring substrate 120 and/or the arrangement of the conductive pads 116. The groups of guiding patterns 118-1 and 118-11 each includes M1 dot patterns arranged along the third direction D3; the groups of guiding patterns 118-2 and 118-10 each includes M2 dot patterns arranged along the third direction D3; the groups of guiding patterns 118-3 and 118-9 each includes M3 dot patterns arranged along the third direction D3; the groups of guiding patterns 118-4 and 118-8 each includes M4 dot patterns arranged along the third direction D3; the groups of guiding patterns 118-5 and 118-7 each includes M5 dot patterns arranged along the third direction D3; and the group of guiding patterns 118-6 includes M6 dot patterns arranged along the third direction D3. In some embodiments, the groups of guiding patterns 118-1 and 118-11 each includes two dot patterns arranged along the third direction D3; the groups of guiding patterns 118-2 and 118-10 each includes three dot patterns arranged along the third direction D3; the groups of guiding patterns 118-3 and 118-9 each includes four dot patterns arranged along the third direction D3; the groups of guiding patterns 118-4 and 118-8 each includes four dot patterns arranged along the five direction D3; the groups of guiding patterns 118-5 and 118-7 each includes six dot patterns arranged along the third direction D3; and the group of guiding patterns 118-6 includes seven dot patterns arranged along the third direction D3. The dot patterns of the groups of guiding patterns 118-1, 118-2, 118-3, 118-4, 118-5, 118-6, 118-7, 118-8, 118-9, 118-1 and 118-11 may accelerate flow speed of the flowable encapsulation material 130 in the third direction D3 because of the small distance between the guiding patterns 118 and the first surfaces S1 of the wiring substrates 120. Various number of dot patterns in the groups of guiding patterns 118-1, 118-2, 118-3, 118-4, 118-5, 118-6, 118-7, 118-8, 118-9, 118-1 and 118-11 may provide different degrees of acceleration in flow speed of the flowable encapsulation material 130. The group of guiding patterns 118-6 provide highest degree of acceleration in flow speed of the flowable encapsulation material 130 along the third direction D3, and the rows of guiding patterns 118-1 and 118-11 provide lowest degree of acceleration in flow speed of the flowable encapsulation material 130 along the third direction D3.

Due to different degrees of acceleration provided by the groups of guiding patterns 118-1, 118-2, 118-3, 118-4, 118-5, 118-6, 118-7, 118-8, 118-9, 118-1 and 118-11, the flow front FF2 of the flowable encapsulation material 130 can be properly controlled, and encysted voids are thus not occurred in the flowable encapsulation material 130.

Figure 5:
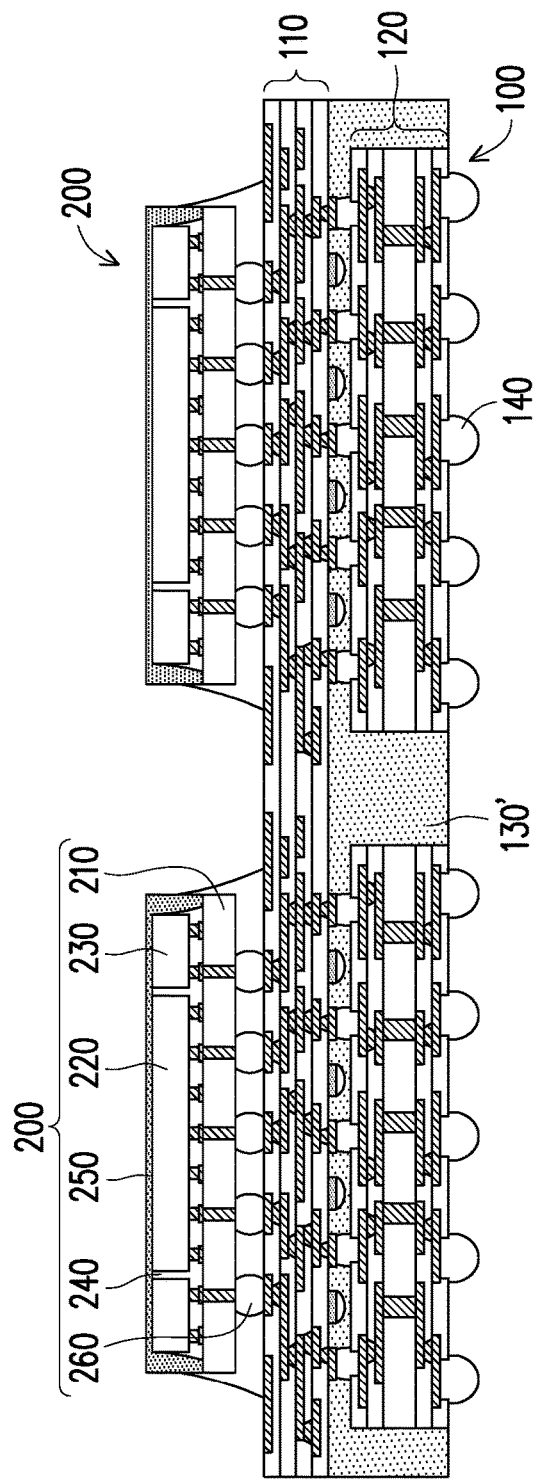

Referring to FIG. 4 and FIG. 5, a de-bonding process is performed to de-bond the encapsulated wiring structure 100 from the carrier C. After de-bonding the encapsulated wiring structure 100 from the carrier C, the encapsulated wiring structure 100 may be flip upside down such that a top surface of the redistribution circuit structure 110 is revealed. In some embodiments, as illustrated in FIG. 5, the topmost dielectric layer among the stacked dielectric layer 112 and the topmost redistribution wiring among the redistribution wirings 114 are revealed after performing the de-bonding process of the encapsulated wiring structure 100.

Semiconductor devices 200 are provided and mounted on the encapsulated wiring structure 100 through a chip-to-wafer bonding process, for example, such that the semiconductor devices 200 are electrically connected to the topmost redistribution wiring 114 of the redistribution circuit structure 110. In some embodiments, the semiconductor devices 200 may be chip packages each including an interposer 210, a semiconductor die 220, memory cubes 230, an underfill 240, an insulating encapsulation 250, and conductive terminals 260. The semiconductor die 220 and the memory cubes 230 are disposed on and electrically connected to the interposer 210. The underfill 240 fills the space between the interposer 210 and the semiconductor die 220 as well as the space between the interposer 210 and the memory cubes 230. The insulating encapsulation 250 encapsulates the semiconductor die 220, the memory cubes 230 and the underfill 240. The conductive terminals 260 are disposed on the bottom surface of the interposer 210. The semiconductor devices 200 are electrically connected to the redistribution circuit structure 110 through the conductive terminals 260.

The interposer 210 may be a semiconductor interposer (e.g., a silicon interposer) including through semiconductor vias (e.g. through silicon vias). The semiconductor die 220 may be logic die, a system on chip (SOC) die or other suitable semiconductor die. The memory cubes 230 may include high bandwidth memory (HBM) cubes or other suitable memory device. The material of the underfill 240 is an insulating material and may include a resin (e.g., epoxy resin), a filler material, a stress release agent (SRA), an adhesion promoter, other material, or a combination thereof. The material of the insulating encapsulation 250 may include molding compound or molded underfill (MUF). In some embodiments, the material of the insulating encapsulation 250 may include epoxy resins, phenolic hardeners, silicas, catalysts, pigments, mold release agents and so on. The conductive terminals 260 may include ball-grid array (BGA) balls.

Figure 6:
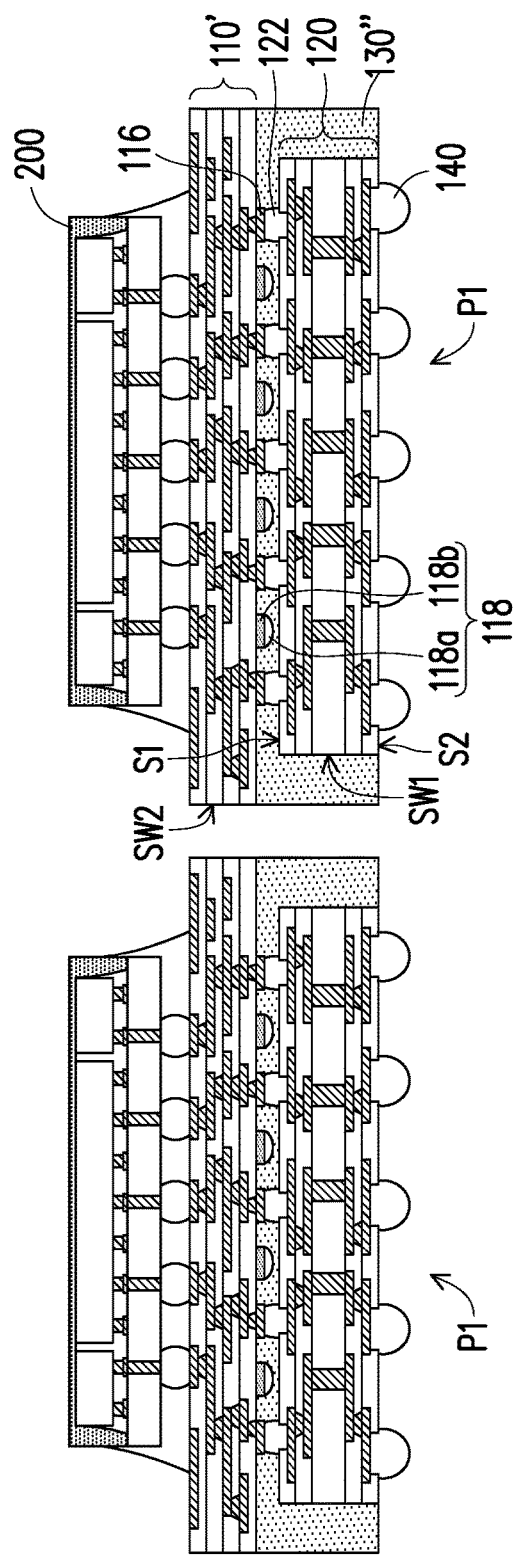

Referring to FIG. 5 and FIG. 6, after the semiconductor devices 200 are mounted on the encapsulated wiring structure 100, a singulation process is performed to singulate the encapsulated wiring structure 100 such that package structures P1 are obtained. Each of the package structure P may include a wiring substrate 120, conductive terminals 122, an insulating encapsulation 130", a redistribution circuit structure 110', guiding patterns 118 and a semiconductor device 200. The conductive terminals 122 are disposed on a first surface S1 of the wiring substrate 120. The insulating encapsulation 130" laterally encapsulates the wiring substrate 120 and the conductive terminals 122. The redistribution circuit structure 110' is disposed on the insulating encapsulation 130" and the conductive terminals 122, and the redistribution circuit structure 110' is electrically connected to the wiring substrate 120 through the conductive terminals 122. The guiding patterns 118 are disposed between the wiring substrate 120 and the redistribution circuit structure 110', and the guiding patterns 118 are in contact with and encapsulated by the insulating encapsulation 130". In other words, the guiding patterns 118 are embedded in the insulating encapsulation 130", and the guiding patterns 118 are spaced apart from the wiring substrate 120 by the insulating encapsulation 130". The semiconductor device 200 is disposed on a top surface of the redistribution circuit structure 110', and the semiconductor device 200 is electrically connected to the wiring substrate 120 through the redistribution circuit structure 110' and the conductive terminals 122. In addition, the package structure P may further include conductive terminals 140 disposed on a second surface S2 of the wiring substrate 120.

In some embodiments, the first surface S1 of the wiring substrate 120 and sidewalls SW1 of the wiring substrate 120 are encapsulated by the insulating encapsulation 130", and sidewalls SW2 of the redistribution circuit structure 110' are substantially aligned with sidewalls SW1 of insulating encapsulation 130". In some embodiments, the redistribution circuit structure 110' includes conductive pads 116, the conductive pads 116 and the guiding patterns 118 are disposed on a bottom surface of the redistribution circuit structure 110', the conductive terminals 122 are disposed between the conductive pads 116 and the wiring substrate 120, and the guiding patterns 118 are electrically floating. In some embodiments, each of the guiding patterns 118 includes a dot-shaped guiding pattern 118a and a conductive coating 118b disposed on the dot-shaped guiding pattern 118a. In some embodiments, a material of the dot-shaped guiding patterns 118a is the same as a material of the conductive pads 116, and a material of the conductive coatings 118b is the same as a material of the conductive terminals 122.

Figure 7:
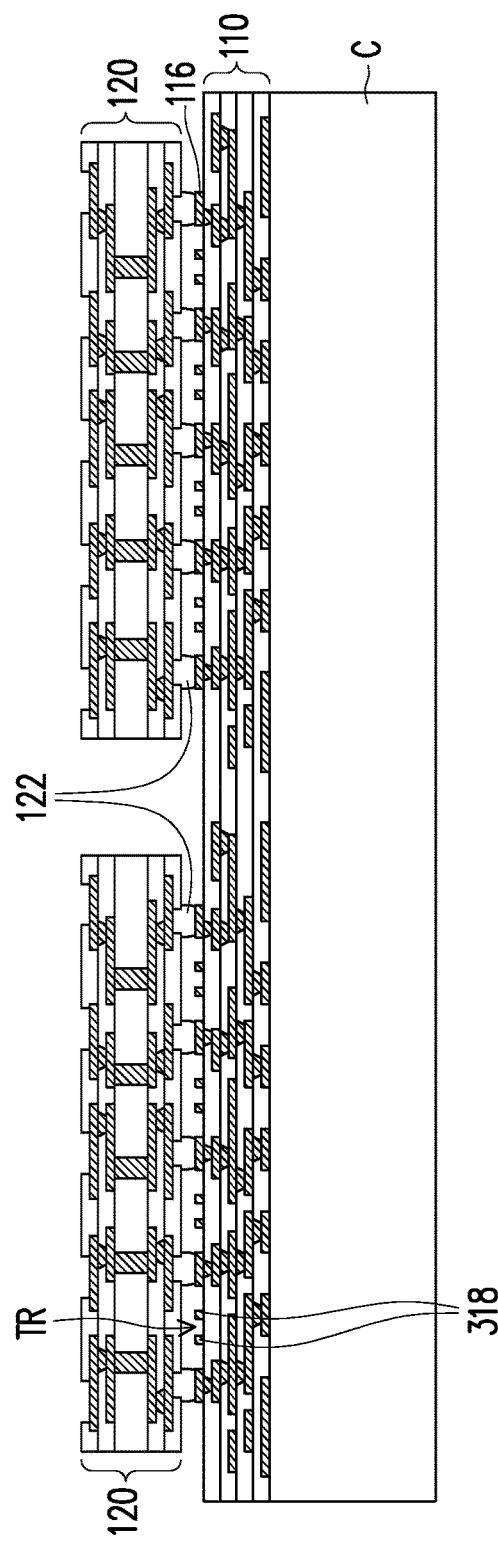
FIG. 7 is a cross-sectional view schematically illustrating guiding strips in accordance with some other embodiments of the present disclosure.
Figure 8:
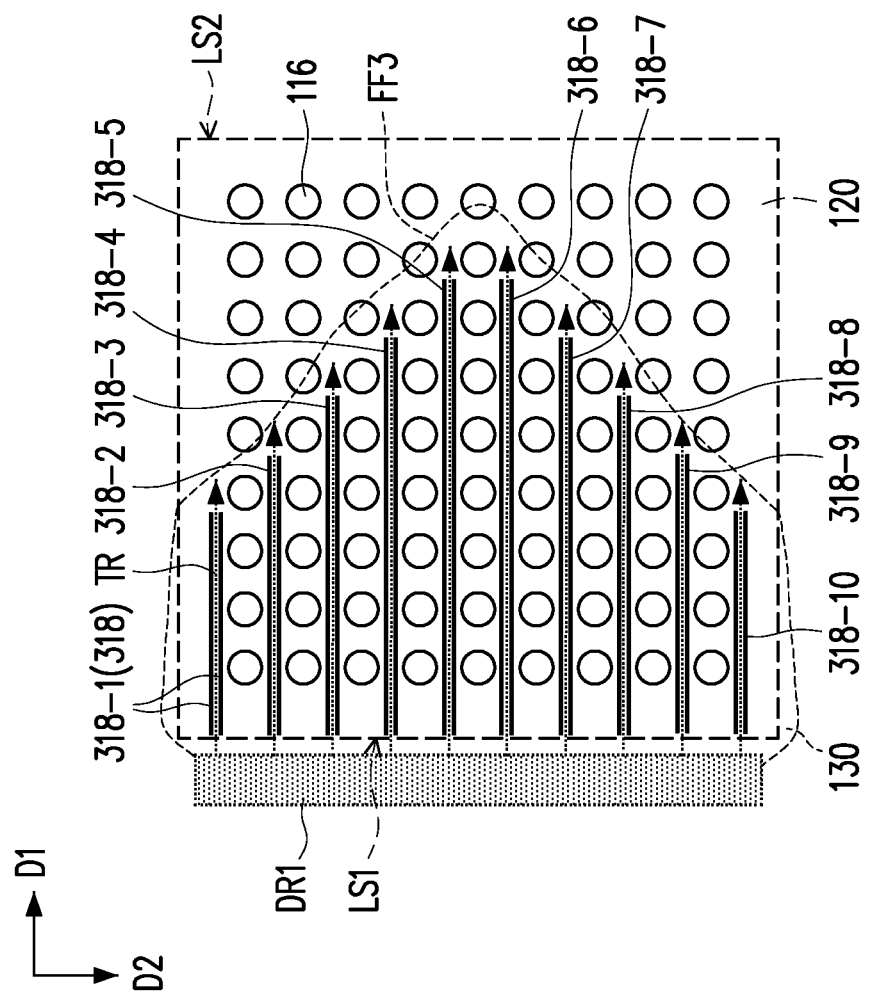
FIG. 8 schematically illustrates a top view of FIG. 7.

FIG. 7 is a cross-sectional view schematically illustrating guiding strips in accordance with some other embodiments of the present disclosure. FIG. 8 schematically illustrates a top view of FIG. 7.

Referring to FIG. 7 and FIG. 8, in the present embodiment, the guiding patterns 318 includes pairs of parallel guiding strips on the redistribution circuit structure 110, and each pair of parallel guiding strips among the pairs of parallel guiding strips defines a guiding trench TR, respectively. In some embodiments, width of the guiding trenches T defined by the parallel guiding strips ranges from about 5 micrometers to about 50 micrometers. Furthermore, the guiding trenches T may be different in length.

As illustrated in FIG. 8, the guiding patterns 318 includes multiple parallel guiding strips 318-1, 318-2, 318-3, 318-4, 318-5, 318-6, 318-7, 318-8, 318-9 and 318-10, wherein the length of the parallel guiding strips 318-5 and 318-6 is greater than that of the parallel guiding strips 318-4 and 318-7, the length of the parallel guiding strips 318-4 and 318-7 is greater than that of the parallel guiding strips 318-3 and 318-8, the length of the parallel guiding strips 318-3 and 318-8 is greater than that of the parallel guiding strips 318-2 and 318-9, and the length of the parallel guiding strips 318-2 and 318-9 is greater than that of the parallel guiding strips 318-1 and 318-10.

The parallel guiding strips 318-1, 318-2, 318-3, 318-4, 318-5, 318-6, 318-7, 318-8, 318-9 and 318-10 may accelerate flow speed of the flowable encapsulation material 130 in the first direction D1 because of narrow trenches defined thereby. The parallel guiding strips 318-1, 318-2, 318-3, 318-4, 318-5, 318-6, 318-7, 318-8, 318-9 and 318-10 with various lengths may provide different degrees of acceleration in flow speed of the flowable encapsulation material 130. The parallel guiding strips 318-5 and 318-6 provide highest degree of acceleration in flow speed of the flowable encapsulation material 130 along the first direction D1, and the parallel guiding strips 318-1 and 318-10 provide lowest degree of acceleration in flow speed of the flowable encapsulation material 130 along the first direction D1.

Due to different degrees of acceleration provided by the parallel guiding strips 318-1, 318-2, 318-3, 318-4, 318-5, 318-6, 318-7, 318-8, 318-9 and 318-10, the flow front FF3 of the flowable encapsulation material 130 can be properly controlled, and encysted voids are thus not occurred in the flowable encapsulation material 130.

Figure 9:
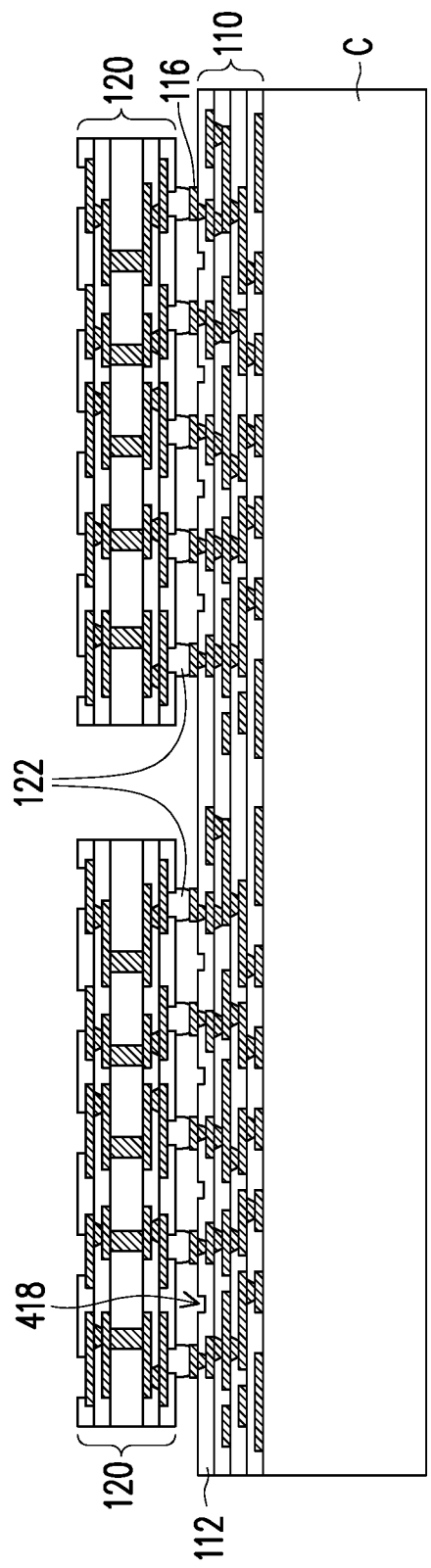
FIG. 9 is a cross-sectional view schematically illustrating parallel guiding trenches in accordance with some embodiments of the present disclosure.
Figure 10:
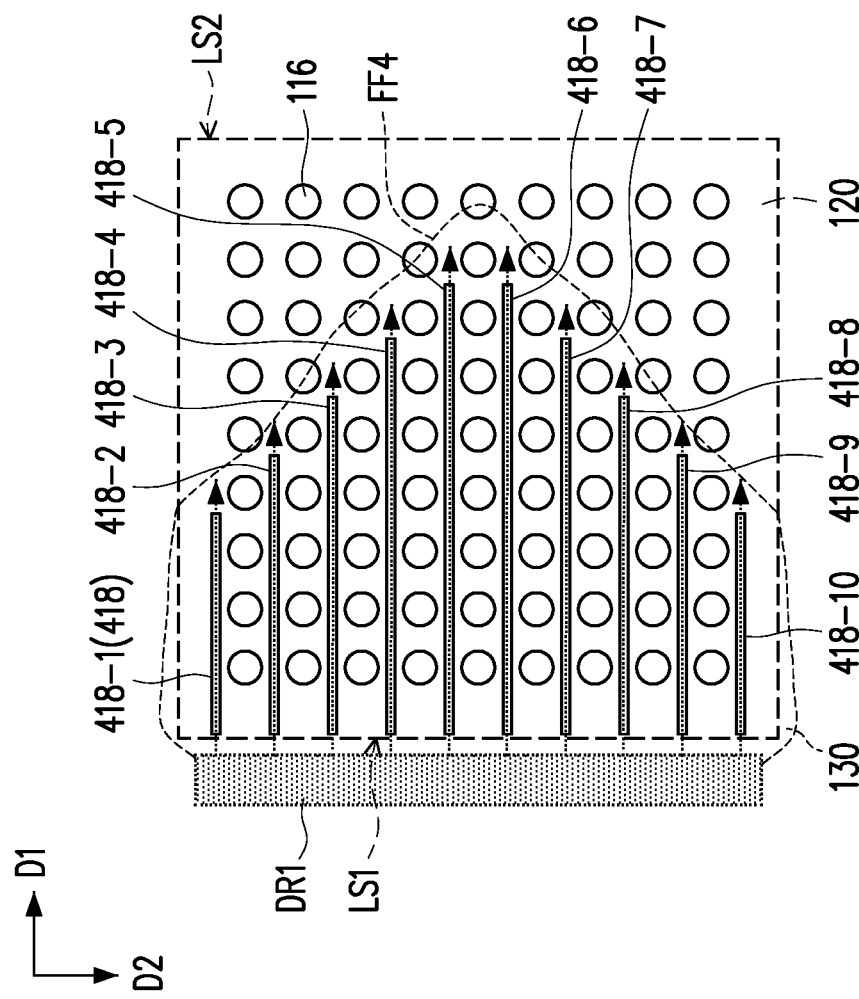
FIG. 10 schematically illustrates a top view of FIG. 9.

FIG. 9 is a cross-sectional view schematically illustrating parallel guiding trenches in accordance with some embodiments of the present disclosure. FIG. 10 schematically illustrates a top view of FIG. 9.

Referring to FIG. 9 and FIG. 10, in the present embodiment, the guiding patterns 418 include parallel guiding trenches 418-1, 418-2, 418-3, 418-4, 418-5, 418-6, 418-7, 418-8, 418-9 and 418-10 defined in an outermost (e.g., the topmost dielectric layer) dielectric layer 112 of the redistribution circuit structure 110.

As illustrated in FIG. 10, the guiding patterns 318 includes multiple parallel guiding trenches 418-1, 418-2, 418-3, 418-4, 418-5, 418-6, 418-7, 418-8, 418-9 and 418-10, wherein the length of the parallel guiding trenches 418-5 and 418-6 is greater than that of the parallel guiding trenches 418-4 and 418-7, the length of the parallel guiding trenches 418-4 and 418-7 is greater than that of the parallel guiding trenches 418-3 and 418-8, the length of the parallel guiding trenches 418-3 and 418-8 is greater than that of the parallel guiding trenches 418-2 and 418-9, and the length of the parallel guiding trenches 418-2 and 418-9 is greater than that of the parallel guiding trenches 418-1 and 418-10.

The parallel guiding trenches 418-1, 418-2, 418-3, 418-4, 418-5, 418-6, 418-7, 418-8, 418-9 and 418-10 may accelerate flow speed of the flowable encapsulation material 130 in the first direction D1 because of narrow trenches defined thereby. The parallel guiding trenches 418-1, 418-2, 418-3, 418-4, 418-5, 418-6, 418-7, 418-8, 418-9 and 418-10 with various lengths may provide different degrees of acceleration in flow speed of the flowable encapsulation material 130. The parallel guiding trenches 418-5 and 418-6 provide highest degree of acceleration in flow speed of the flowable encapsulation material 130 along the first direction D1, and the parallel guiding trenches 418-1 and 418-10 provide lowest degree of acceleration in flow speed of the flowable encapsulation material 130 along the first direction D1.

Due to different degrees of acceleration provided by the parallel guiding trenches 418-1, 418-2, 418-3, 418-4, 418-5, 418-6, 418-7, 418-8, 418-9 and 418-10, the flow front FF4 of the flowable encapsulation material 130 can be properly controlled, and encysted voids are thus not occurred in the flowable encapsulation material 130.

Figure 11:
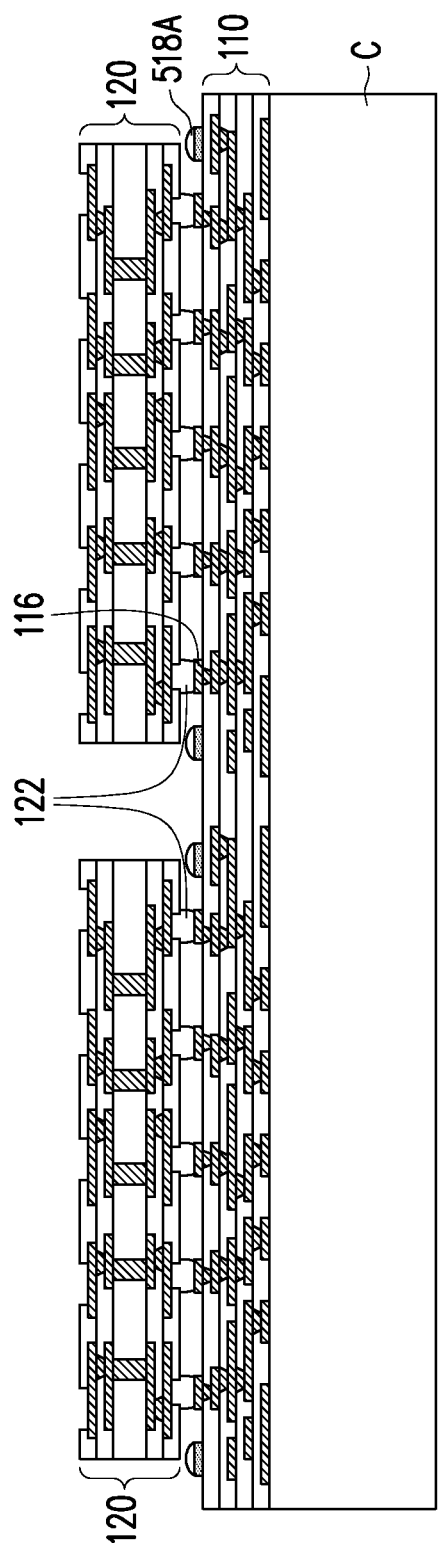
FIG. 11 and FIG. 12 are cross-sectional views schematically illustrating parallel retarding strips in accordance with some embodiments of the present disclosure.
Figure 12:
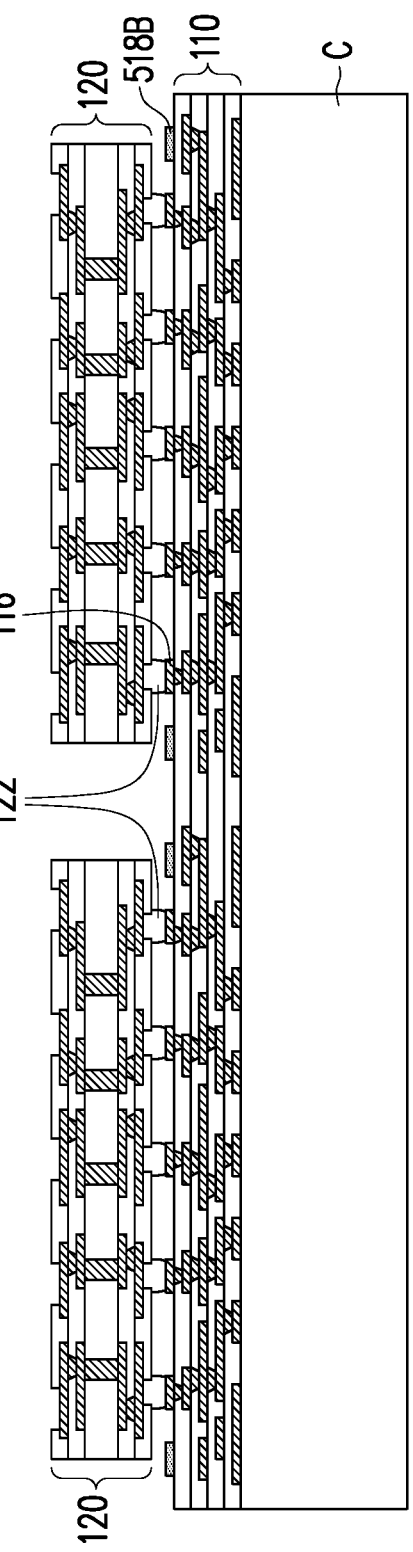
Figure 13:
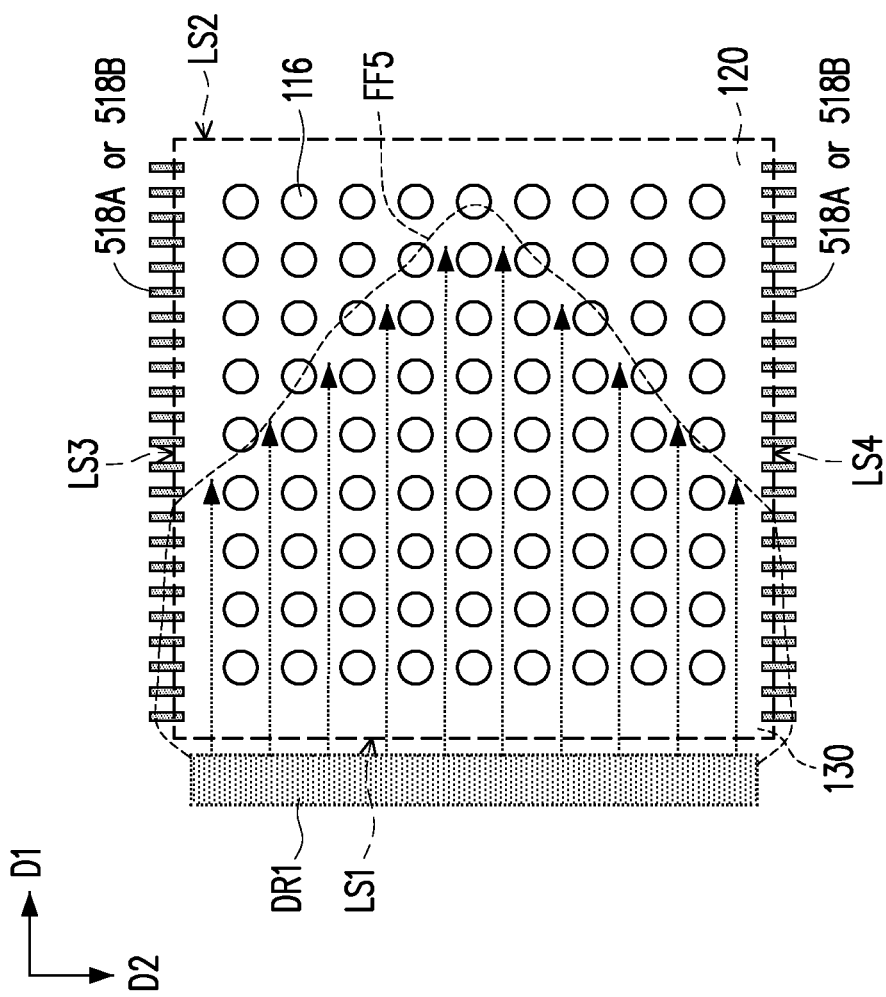
FIG. 13 schematically illustrates a top view of FIG. 11 or FIG. 12.

FIG. 11 and FIG. 12 are cross-sectional views schematically illustrating parallel retarding strips in accordance with some embodiments of the present disclosure. FIG. 13 schematically illustrates a top view of FIG. 11 or FIG. 12.

Referring to FIG. 11, FIG. 12 and FIG. 13, in the present embodiment, the guiding patterns includes parallel retarding strips 518A or 518B arranged along two opposite lateral sides LS3 and LS4 of the wiring substrate 120, and an extending direction of the parallel retarding strips 518A or 518B is substantially perpendicular to the two opposite lateral sides LS3 and LS4 of the wiring substrate 120.

As illustrated in FIG. 11 and FIG. 13, in some embodiments, the guiding patterns includes multiple parallel retarding strips 518A, wherein the structure of the parallel retarding strips 518A is similar with that of the guiding pattern 118 illustrated in FIG. 1. As illustrated in FIG. 12 and FIG. 13, in some other embodiments, the guiding patterns includes multiple parallel retarding strips 518B, wherein the material of the retarding strips 518B includes polymer or metal.

The parallel retarding strips 518A and 518B may slow down flow speed of the flowable encapsulation material 130 flowing along the lateral sides LS3 and LS4 of the wiring substrate 120. Due to the retarding strips 518A and 518B, the flow front FF5 of the flowable encapsulation material 130 can be properly controlled, and encysted voids are thus not occurred in the flowable encapsulation material 130.

It is noted that features of the above-mentioned embodiments may be combined to effectively control the flowing path of the flowable encapsulation material 130 to minimize possibility of encysted voids occurred in the flowable encapsulation material 130.

In accordance with some embodiments of the disclosure, a package structure including a wiring substrate, conductive terminals, an insulating encapsulation, a redistribution circuit structure, guiding patterns and a semiconductor device. The conductive terminals are disposed on a surface of the wiring substrate. The insulating encapsulation laterally encapsulates the wiring substrate and the conductive terminals. The redistribution circuit structure is disposed on the insulating encapsulation and the conductive terminals, and the redistribution circuit structure is electrically connected to the wiring substrate through the conductive terminals. The guiding patterns are disposed between the wiring substrate and the redistribution circuit structure, and the guiding patterns are in contact with and encapsulated by the insulating encapsulation. The semiconductor device is disposed on a top surface of the redistribution circuit structure, and the semiconductor device is electrically connected to the wiring substrate through the redistribution circuit structure and the conductive terminals. In some embodiments, the surface of the wiring substrate and sidewalls of the wiring substrate are encapsulated by the insulating encapsulation, and sidewalls of the redistribution circuit structure are substantially aligned with sidewalls of insulating encapsulation. In some embodiments, the redistribution circuit structure includes conductive pads, the conductive pads and the guiding patterns are disposed on a bottom surface of the redistribution circuit structure, the conductive terminals are disposed between the conductive pads and the wiring substrate, and the guiding patterns are electrically floating. In some embodiments, each of the guiding patterns includes a dot-shaped guiding pattern and a conductive coating disposed on the dot-shaped guiding pattern. In some embodiments, a material of the dot-shaped guiding patterns is the same as a material of the conductive pads, and a material of the conductive coatings is the same as a material of the conductive terminals. In some embodiments, the guiding patterns includes pairs of parallel guiding strips, and each pair of parallel guiding strips among the pairs of parallel guiding strips defines a guiding trench, respectively. In some embodiments, the guiding patterns include parallel guiding trenches defined in a bottommost dielectric layer of the redistribution circuit structure. In some embodiments, the guiding patterns includes parallel retarding strips arranged along two opposite sides of the wiring substrate, and an extending direction of the parallel retarding strips is substantially perpendicular to the two opposite sides of the wiring substrate.

In accordance with some other embodiments of the disclosure, a package structure including a wiring substrate, an insulating encapsulation, a redistribution circuit structure and a semiconductor device is provided. The wiring substrate includes first conductive terminals and second conductive terminals disposed on opposite surfaces thereof. The insulating encapsulation laterally encapsulates the wiring substrate and the first conductive terminals. The redistribution circuit structure covers the insulating encapsulation and electrically connects to the first conductive terminals, wherein the redistribution circuit structure includes guiding patterns embedded in the insulating encapsulation, and the guiding patterns are spaced apart from the wiring substrate by the insulating encapsulation. The semiconductor device is disposed on a top surface of the redistribution circuit structure, and the semiconductor device is electrically connected to the wiring substrate through the redistribution circuit structure and the first conductive terminals. In some embodiments, a first surface of the wiring substrate and sidewalls of the wiring substrate are covered by the insulating encapsulation, a second surface of the wiring substrate is revealed by the insulating encapsulation, the first surface of the wiring substrate is opposite to the second surface of the wiring substrate, and sidewalls of the redistribution circuit structure are substantially aligned with sidewalls of insulating encapsulation. In some embodiments, the redistribution circuit structure includes conductive pads, the conductive pads and the guiding patterns are disposed on a bottom surface of the redistribution circuit structure, the first conductive terminals are disposed between the conductive pads and the wiring substrate, and the guiding patterns are electrically floating. In some embodiments, each of the guiding patterns includes a dot-shaped guiding pattern and a conductive coating disposed on the dot-shaped guiding pattern. In some embodiments, a material of the dot-shaped guiding patterns is the same as a material of the conductive pads, and a material of the conductive coatings is the same as a material of the first conductive terminals. In some embodiments, the guiding patterns include parallel guiding trenches. In some embodiments, the guiding patterns includes retarding strips arranged along two opposite sides of the wiring substrate, and an extending direction of the retarding strips is substantially perpendicular to the two opposite sides of the wiring substrate.

In accordance with some other embodiments of the disclosure, a method including the followings is provided. A redistribution circuit structure including conductive pads and guiding patterns spatially separated from the conductive pads is formed. A wiring substrate including conductive terminals formed thereon is provided. The wiring substrate is mounted on the redistribution circuit structure to cover the conductive pads and the guiding patterns such that the wiring substrate is electrically connected to the redistribution circuit structure through conductive terminals. A flowable encapsulation material is dispensed along a side of the wiring substrate such that the flowable encapsulation material flows into a space between the redistribution circuit structure and the wiring substrate through guidance of the guiding patterns. The flowable encapsulation material in the space between the redistribution circuit structure and the wiring substrate is cured. In some embodiments, the flowable encapsulation material is dispensed along a first lateral side of the wiring substrate and flows towards a second lateral side of the wiring substrate, the second lateral side of the wiring substrate is opposite to the first lateral side of the wiring substrate, the guiding patterns comprises dot patterns divided into a plurality of dot groups, and each dot group among the dot groups comprises dot patterns arranged along a first flowing direction from the first lateral side to the second lateral side. In some embodiments, the flowable encapsulation material is dispensed along a first lateral side and a third lateral side of the wiring substrate and respectively flows towards a second lateral side and a fourth lateral side of the wiring substrate, the second lateral side of the wiring substrate is opposite to the first lateral side of the wiring substrate, the fourth lateral side of the wiring substrate is opposite to the third lateral side of the wiring substrate, the guiding patterns comprises dot patterns divided into a plurality of dot groups, each dot group among the dot groups comprises dot patterns arranged along a direction, and the direction is from a first corner between the first lateral side and the third lateral side to a second corner opposite to the first corner. In some embodiments, the flowable encapsulation material is dispensed along a first lateral side of the wiring substrate and flows towards a second lateral side of the wiring substrate, the second lateral side of the wiring substrate is opposite to the first lateral side of the wiring substrate, and the guiding patterns includes guiding trenches extending along a flowing direction from the first lateral side toward the second lateral side. In some embodiments, the flowable encapsulation material is dispensed along a first lateral side of the wiring substrate and flows towards a second lateral side of the wiring substrate, the second lateral side of the wiring substrate is opposite to the first lateral side of the wiring substrate, the guiding patterns includes retarding strips arranged along a third lateral side of the wiring substrate and a fourth lateral side of the wiring substrate, the fourth lateral side of the wiring substrate is opposite to the third lateral side of the wiring substrate, and an extending direction of the parallel retarding strips is substantially perpendicular to the third and the fourth lateral sides of the wiring substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a wiring substrate;
conductive terminals disposed on a surface of the wiring substrate;
an insulating encapsulation laterally encapsulating the wiring substrate and the conductive terminals;
a redistribution circuit structure disposed on the insulating encapsulation and the conductive terminals, and the redistribution circuit structure being electrically connected to the wiring substrate through the conductive terminals;
guiding patterns disposed between the wiring substrate and the redistribution circuit structure, and the guiding patterns being in contact with and encapsulated by the insulating encapsulation; and
a semiconductor device disposed on a top surface of the redistribution circuit structure, and the semiconductor device being electrically connected to the wiring substrate through the redistribution circuit structure and the conductive terminals.

2. The package structure as claimed in claim 1, wherein the surface of the wiring substrate and sidewalls of the wiring substrate are encapsulated by the insulating encapsulation, and sidewalls of the redistribution circuit structure are substantially aligned with sidewalls of insulating encapsulation.

3. The package structure as claimed in claim 1, wherein the redistribution circuit structure comprises conductive pads, the conductive pads and the guiding patterns are disposed on a bottom surface of the redistribution circuit structure, the conductive terminals are disposed between the conductive pads and the wiring substrate, and the guiding patterns are electrically floating.

4. The package structure as claimed in claim 3, wherein each of the guiding patterns comprises a dot-shaped guiding pattern and a conductive coating disposed on the dot-shaped guiding pattern.

5. The package structure as claimed in claim 4, wherein a material of the dot-shaped guiding patterns is the same as a material of the conductive pads, and a material of the conductive coatings is the same as a material of the conductive terminals.

6. The package structure as claimed in claim 1, wherein the guiding patterns comprises pairs of parallel guiding strips, and each pair of parallel guiding strips among the pairs of parallel guiding strips defines a guiding trench, respectively.

7. The package structure as claimed in claim 1, wherein the guiding patterns comprise parallel guiding trenches defined in a bottommost dielectric layer of the redistribution circuit structure.

8. The package structure as claimed in claim 1, wherein the guiding patterns comprises parallel retarding strips arranged along two opposite sides of the wiring substrate, and an extending direction of the parallel retarding strips is substantially perpendicular to the two opposite sides of the wiring substrate.

9. A package structure, comprising:
a wiring substrate comprising first conductive terminals and second conductive terminals disposed on opposite surfaces thereof;
an insulating encapsulation laterally encapsulating the wiring substrate and the first conductive terminals;
a redistribution circuit structure covering the insulating encapsulation and electrically connected to the first conductive terminals, wherein the redistribution circuit structure comprises guiding patterns embedded in the insulating encapsulation, and the guiding patterns are spaced apart from the wiring substrate by the insulating encapsulation; and
a semiconductor device disposed on a top surface of the redistribution circuit structure, and the semiconductor device being electrically connected to the wiring substrate through the redistribution circuit structure and the first conductive terminals.

10. The package structure as claimed in claim 9, wherein a first surface of the wiring substrate and sidewalls of the wiring substrate are covered by the insulating encapsulation, a second surface of the wiring substrate is revealed by the insulating encapsulation, the first surface of the wiring substrate is opposite to the second surface of the wiring substrate, and sidewalls of the redistribution circuit structure are substantially aligned with sidewalls of insulating encapsulation.

11. The package structure as claimed in claim 9, wherein the redistribution circuit structure comprises conductive pads, the conductive pads and the guiding patterns are disposed on a bottom surface of the redistribution circuit structure, the first conductive terminals are disposed between the conductive pads and the wiring substrate, and the guiding patterns are electrically floating.

12. The package structure as claimed in claim 11, wherein each of the guiding patterns comprises a dot-shaped guiding pattern and a conductive coating disposed on the dot-shaped guiding pattern.

13. The package structure as claimed in claim 12, wherein a material of the dot-shaped guiding patterns is the same as a material of the conductive pads, and a material of the conductive coatings is the same as a material of the first conductive terminals.

14. The package structure as claimed in claim 9, wherein the guiding patterns comprise parallel guiding trenches.

15. The package structure as claimed in claim 9, wherein the guiding patterns comprises retarding strips arranged along two opposite sides of the wiring substrate, and an extending direction of the retarding strips is substantially perpendicular to the two opposite sides of the wiring substrate.

16. A method, comprising:
forming on a redistribution circuit structure comprising conductive pads and guiding patterns spatially separated from the conductive pads;
providing a wiring substrate comprising conductive terminals formed thereon;
mounting the wiring substrate on the redistribution circuit structure to cover the conductive pads and the guiding patterns such that the wiring substrate is electrically connected to the redistribution circuit structure through conductive terminals;
dispensing a flowable encapsulation material at a side of the wiring substrate such that the flowable encapsulation material flows into a space between the redistribution circuit structure and the wiring substrate through guidance of the guiding patterns; and
curing the flowable encapsulation material in the space between the redistribution circuit structure and the wiring substrate.

17. The method as claimed in claim 16, wherein the flowable encapsulation material is dispensed along a first lateral side of the wiring substrate and flows towards a second lateral side of the wiring substrate, the second lateral side of the wiring substrate is opposite to the first lateral side of the wiring substrate,
the guiding patterns comprises dot patterns divided into a plurality of dot groups, and
each dot group among the dot groups comprises dot patterns arranged along a first flowing direction from the first lateral side to the second lateral side.

18. The method as claimed in claim 16, wherein the flowable encapsulation material is dispensed along a first lateral side and a third lateral side of the wiring substrate and respectively flows towards a second lateral side and a fourth lateral side of the wiring substrate,
the second lateral side of the wiring substrate is opposite to the first lateral side of the wiring substrate, the fourth lateral side of the wiring substrate is opposite to the third lateral side of the wiring substrate,
the guiding patterns comprises dot patterns divided into a plurality of dot groups, each dot group among the dot groups comprises dot patterns arranged along a direction, and the direction is from a first corner between the first lateral side and the third lateral side to a second corner opposite to the first corner.

19. The method as claimed in claim 16, wherein the flowable encapsulation material is dispensed along a first lateral side of the wiring substrate and flows towards a second lateral side of the wiring substrate, the second lateral side of the wiring substrate is opposite to the first lateral side of the wiring substrate, and the guiding patterns comprises guiding trenches extending along a flowing direction from the first lateral side toward the second lateral side.

20. The method as claimed in claim 16, wherein the flowable encapsulation material is dispensed along a first lateral side of the wiring substrate and flows towards a second lateral side of the wiring substrate, the second lateral side of the wiring substrate is opposite to the first lateral side of the wiring substrate, the guiding patterns comprises retarding strips arranged along a third lateral side of the wiring substrate and a fourth lateral side of the wiring substrate, the fourth lateral side of the wiring substrate is opposite to the third lateral side of the wiring substrate, and an extending direction of the parallel retarding strips is substantially perpendicular to the third and the fourth lateral sides of the wiring substrate.

* * * * *